United States Patent
Shukla et al.

(10) Patent No.: US 7,781,076 B2
(45) Date of Patent: Aug. 24, 2010

(54) HETEROPYRENE-BASED SEMICONDUCTOR MATERIALS FOR ELECTRONIC DEVICES AND METHODS OF MAKING THE SAME

(75) Inventors: Deepak Shukla, Webster, NY (US);
Thomas R. Welter, Webster, NY (US);
Ann L. Carroll-Lee, Webster, NY (US);
Wendy G. Ahearn, Rochester, NY (US);
Douglas R. Robello, Webster, NY (US)

(73) Assignee: Eastman Kodak Company, Rochester, NJ (US)

(*) Notice: Subject to any disclaimer, the term of this patent is extended or adjusted under 35 U.S.C. 154(b) by 137 days.

(21) Appl. No.: 11/768,262

(22) Filed: Jun. 26, 2007

(65) Prior Publication Data
US 2009/0001353 A1  Jan. 1, 2009

(51) Int. Cl.
*H01L 51/30* (2006.01)
(52) U.S. Cl. .......................... 428/690; 544/5
(58) Field of Classification Search ............... None
See application file for complete search history.

(56) References Cited
U.S. PATENT DOCUMENTS 6,300,612 B1 * 10/2001 Yu ..................... 250/208.1
6,740,900 B2 * 5/2004 Hirai ...................... 257/40
2001/0032980 A1 * 10/2001 Hayashi et al. .......... 257/66

FOREIGN PATENT DOCUMENTS

| EP | 1 589 089 | 10/2005 |
| WO | 2006/057325 | 1/2006 |
| WO | 2007/118799 | 10/2007 |

OTHER PUBLICATIONS

Nakasuji, Methylthio- and Ethanediyldithio-Substitued 1,6-Dithiapyrenes . . . ,J. Am. Chem. Soc. 1987, 109, 6970-6975.*
Nakasuji, New multi-stage redox systems . . . Pure Applied Chem, vol. 62, N0. p. 477-482, 1990.*
Hengjun Zhang, et al., "Novel butterfly pyrene-based organic semiconductors for field effect transistors" Chemical Communications, 2006, pp. 755-757.
Ying Wang, et al., "1-Imino Nitroxide Pyrene for High Performance Organic Field-Effect Transistors with Low Operating Voltage," American Chemical Society, 2006, 128, pp. 13058-13059.

(Continued)

*Primary Examiner*—D. Lawrence Tarazano
*Assistant Examiner*—Gregory Clark
(74) *Attorney, Agent, or Firm*—Chris P. Konkol; J. Lanny Tucker

(57) ABSTRACT

A thin layer of organic semiconductor material comprising a comprising an organic semiconductor thin film material is disclosed in which the thin film material substantially comprises a heteropyrene compound or derivative. In one embodiment, a thin film transistor comprises a layer of the organic semiconductor material. Further disclosed is a process for fabricating an organic thin-film transistor device, preferably by relative low-temperature sublimation or solution-phase deposition onto a substrate.

19 Claims, 1 Drawing Sheet

OTHER PUBLICATIONS

Fabrice Moggia, et al., "Synthesis and thin film electronic properties of two pyrene-substituted oligothiophene derivatives," Journal of Materials Chemistry, 2006, 16, pp. 2380-2386.

J. Morgado et al.: Synthetic Metals, vol. 86, 1997, pp. 1967-1970.

Tyson D.S. et al.: "Synthesis, characterization, and optical properties of a cyano-functionalized 2,3,7,8-tetraaryl-1-6-dioxapyrene", J. of Photochemistry and Photobiology, A: Chemistry, Elseier Sequoia, Lausanne, Ch, vol. 172, No. 1, May 15, 2005, ISSN: 1010-6030 compound 10.

K. Imaeda, et al.,: Bull. Chem.Soc. Jpn., vol. 62, 1989, pp. 372-379.

* cited by examiner

HETEROPYRENE-BASED SEMICONDUCTOR MATERIALS FOR ELECTRONIC DEVICES AND METHODS OF MAKING THE SAME

FIELD OF THE INVENTION

The present invention relates to the use of heteropyrene compounds as semiconductor materials in electronic devices, for example, in thin film transistors for electronic devices. The invention also relates to methods of making such transistors and devices.

BACKGROUND OF THE INVENTION

Thin film transistors (TFTs) are widely used as a switching element in electronics, for example, in active-matrix liquid-crystal displays, smart cards, and a variety of other electronic devices and components thereof. The thin film transistor (TFT) is an example of a field effect transistor (FET). The best-known example of an FET is the MOSFET (Metal-Oxide-Semiconductor-FET), today's conventional switching element for high-speed applications. Presently, most thin film devices are made using amorphous silicon as the semiconductor. Amorphous silicon is a less expensive alternative to crystalline silicon. This fact is especially important for reducing the cost of transistors in large-area applications. Application of amorphous silicon is limited to low speed devices, however, since its maximum mobility (0.5-1.0 cm$^2$/Vsec) is about a thousand times smaller than that of crystalline silicon.

Although amorphous silicon is less expensive than highly crystalline silicon for use in TFTs, amorphous silicon still has its drawbacks. The deposition of amorphous silicon, during the manufacture of transistors, requires relatively costly processes, such as plasma enhanced chemical vapor deposition and high temperatures (about 360° C.) to achieve the electrical characteristics sufficient for display applications. Such high processing temperatures disallow the use of substrates, for deposition, made of certain plastics that might otherwise be desirable for use in applications such as flexible displays.

In the past decade, organic materials have received attention as a potential alternative to inorganic materials such as amorphous silicon for use in semiconductor channels of TFTs. Organic semiconductor materials are simpler to process, especially those that are soluble in organic solvents and, therefore, capable of being applied to large areas by far less expensive processes, such as spin-coating, dip-coating and microcontact printing. Furthermore, organic materials may be deposited at lower temperatures, opening up a wider range of substrate materials, including plastics, for flexible electronic devices. Accordingly, thin film transistors made of organic materials can be viewed as a potential key technology for plastic circuitry or devices where ease of fabrication and/or moderate operating temperatures are important considerations and/or mechanical flexibility of the product is desired.

Organic semiconductor materials can be used in TFTs to provide the switching and/or logic elements in electronic components, many of which require significant mobilities, well above 0.01 cm$^2$/Vs, and current on/off ratios (hereinafter referred to as "on/off ratios") greater than 1000. Organic TFTs having such properties are capable of use for electronic applications such as pixel drivers for displays, identification tags, portable computers, pagers, memory elements in transaction carts, electronic signs, etc.

Organic materials for use as potential semiconductor channels in TFTs are disclosed, for example, in U.S. Pat. No. 5,347,144 to Garnier et al., entitled "Thin-Layer Field-Effect Transistors with MIS Structure Whose Insulator and Semiconductors Are Made of Organic Materials."

A variety of materials have been considered as organic semiconductors, with the most common being fused acenes such as tetracene and pentacene, oligomeric materials containing thiophene or fluorene units, and polymeric materials like regioregular poly(3-alkylthiophene). While polymers may be coated from solution, device performance is poor when compared to well-ordered thin films prepared by high vacuum vapor deposition.

Amongst the acene class of organic semiconductors, pentacene, having five fused benzene rings, is the mainstay of this class and positive charge-carrier mobilities (p-type) have been reported for pentacene-based transistors as high as 3.3 cm$^2$ V$^{-1}$ s$^{-1}$ (Kelley, T. W.; Boardman, L. D.; Dunbar, T. D.; Muyres, D. V.; Pellerite, M.; Smith, T. P., J. Phys. Chem. B 2003, 107, 5877-5881), on/off current ratios greater than 10$_8$ (Knipp, D.; Street, R. A.; Völkel, A.; Ho, J., J Appl. Phys. 2003, 93, 347-355), and sub-threshold voltages of less than 0.5 V (Klauk, H.; Halik, M.; Zschieschang, U.; Schmid, G.; Radlik, W.; Weber, W., J. Appl. Phys. 2002, 92, 5259-5263). These values are comparable or superior to those of amorphous silicon-based devices.

Pentacene has been extensively probed and modified in a search for improved performance, in particular for solubility, for organizational anchoring groups and for electronic modifications. Enhanced solubility of pentacene has been achieved by adding labile Diels-Alder adducts to the central ring (U.S. Patent Publ. No. 2003/0136964 A1) and by the addition of non-labile solubilizing groups (U.S. Pat. No. 6,690,029 to Anthony et al., issued Feb. 10, 2004). These and other strategies can enhance the solubility of pentacene. However, creating an ordered film from a disordered solution or from a vapor phase remains a challenge. C. Nuckolls et al. (J. Am. Chem. Soc. 2004, 126, 15048-15050) recognized this dilemma and sought to functionalize one end of tetracene with methoxy or hydroxyl groups. These asymmetrically placed anchoring groups were intended to organize the molecule at a dielectric surface via hydrogen-bonding attraction. Other types of surface-molecule interactions beyond hydrogen bonding could be imagined for asymmetric type molecules.

The electronic and chemical properties (band gap, HOMO-LUMO levels, oxidation potential) of the pentacene structure have been altered by, for example, replacing both of the terminal rings with thiophene rings (J. G. Laquindanum, H. E. Katz, A. J. Lovinger, J. Am. Chem. Soc. 1998, 120, 664-672). However, the placement of thiophenes at both ends of the acene inevitably leads to a cis-trans mixture. In addition, the unique directing effect of a single ended asymmetric structure is lost with a symmetrical approach. Nevertheless, there are several areas where an alternative semiconductor material could offer improvements. The device architecture, choice of materials and substrate roughness all affect device performance. In pentacene-based devices, these variations have, in part, been attributed to the existence of several polymorphs (Mattheus, C. C.; de Wijs, G. A.; de Groot, R. A.; Palstra, T. T., M. J. Am. Chem. Soc. 2003, 125, 6323-6330). The alignment or structural order of the pentacene molecules differs for each polymorph or crystallographic phase, and this structural order determines the electronic properties of the device. The crystallographic phase adopted by pentacene depends on the process and conditions under which the crystals are formed. The thin film form of pentacene can be converted to the bulk phase by exposure to solvents such as isopropanol, acetone or ethanol. (See, for example, Gundlach et al., Appl. Phys. Lett., 2000, 74(22) 3302).

Additionally, the long-term oxidative and thermal stability of pentacene is unknown, as is the lifetime of pentacene-based semiconductor devices. The ease of synthesis and purification is another factor that must be considered in regard to the utility of an organic semiconductor. In particular, soluble materials may be purified by recrystallization or chromatography, familiar techniques that are not available for fused acenes like pentacene. The ability to construct devices using solution-processing techniques is potentially key for realizing a low cost manufacturing process. And lastly, it is likely that a variety of organic semiconductor materials possessing a range of physical and chemical properties may be required for specific applications.

Pyrenes for use as potential semiconductor materials light emitting transistor devices are disclosed, in WO 2006057325 to Oyamada et al., entitled "Pyrene compound and, utilizing the same, light emitting transistor device and electroluminescence device."

Thienyl substituted pyrene has been used as the active p-type material in thin film transistors but shows a low mobility of 0.0037 cm$^2$/Vs, and very high threshold voltage (Zhang, et al. in *Chemical Communications*, 2005, 7, 755-757). Vacuum evaporated thin films of pyrene end-substituted with oligothiophene has been used as the active layer in field effect transistors but show only modest hole mobility of $10^{-3}$ cm$^2$/Vs (in *Journal of Materials Chemistry* (2006), 16(24), 2380-2386).

Thin film transistors fabricated with vapor-deposited films of 1-imino nitroxide pyrene have been demonstrated to show p-type characteristics, with mobility up to 0.1 cm$^2$/Vs but show a poor current on/off ratio of $10^4$ (in *Journal Am. Chem. Soc.* (2006), 128(40), 13058-13059). Furthermore, this compound is an organic radical which makes it chemically unstable.

In view of the foregoing, we recognize there is a need for new organic semiconductors that are chemically stable and provide stable and reproducible electrical characteristics. The present invention discloses heteropyrene compounds that are useful as organic semiconductors. The compounds of the present invention are reliably prepared, advantageously purified by either gradient sublimation, and/or recrystallization, and/or chromatography, depending on the specific materials.

SUMMARY OF THE INVENTION

The present invention relates to the use of heteropyrene compounds as a semiconductor material, for example, in thin film transistors.

In one embodiment, the present invention relates to the use, in p-channel semiconductor films, of 1,6-heteropyrene compounds in which there the two heteroatoms in the compound, at the 1 and 6 positions, are selected from the group consisting of oxygen and sulfur, wherein any of the positions on the heteropyrene nucleus can be optionally substituted, any two of which substituents can be combined into a ring, either saturated, unsaturated or aromatic fused ring.

Such films are capable of exhibiting, in the film form, the useful field-effect electron mobilities and useful related properties for semiconductor films. Such semiconductor films are also capable of providing device on/off ratios in the range of at least $10^5$.

Another aspect of the present invention is the use of such p-channel semiconductor films in organic thin film transistors, each such transistor further comprising spaced apart first and second contact means connected to a p-channel semiconductor film. A third contact means can be spaced from said first and second contact means and that is adapted for controlling, by means of a voltage applied to the third contact means, a current between the first and second contact means through said film. The first, second, and third contact means can correspond to a drain, source, and gate electrode in a field-effect transistor.

Another aspect of the present invention is directed to a process for fabricating a thin film semiconductor or transistor, preferably by sublimation or solution-phase deposition of the p-channel semiconductor film onto a substrate, wherein the substrate temperature is preferably at a temperature of no more than 250° C. during the deposition.

In one particular embodiment, the present invention is directed to an article comprising, in a thin film transistor, a thin film of organic semiconductor material that comprises a heteropyrene compound. In one embodiment of the invention, the organic semiconductor material comprises a heteropyrene compound represented by the following Structure I:

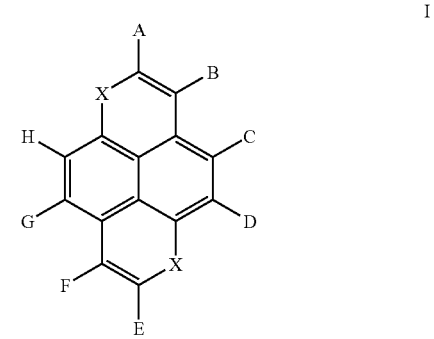

wherein: each X is independently selected from O or S and A, B, C, D, E, F, G, and H are independently hydrogen or a substituent that is consistent with the effective semiconducting properties of the compound in a thin film, and wherein any two of the substituents A, B, C, D, E, F, G, and H can optionally form a non-aromatic ring fused to the heteropyrene moiety, and wherein A and B, and/or E and F, can optionally form an aromatic ring fused to the heteropyrene moiety in Structure I.

As used herein the term "heteropyrene nucleus" or "heteropyrene moiety" refers to the compound of structure I, II, or III in which the substituents A, B, C, D, E, F, G, and H are replaced by an unspecified bond or valence.

The use of such compounds can improve the stability of the semiconductor films or the solution properties, film-forming characteristics, or processability of the semiconductor films. In addition, the heteropyrene compounds of the present invention allows for facile introduction of a wide variety of performance-modifying end substituent A and E groups on the terminal ring. In addition, the end substituent groups A and E may contain added functionality that facilitates interaction with dielectric or conductor surfaces, enables intramolecular organization, enhances solubility in desirable coating solvents, or imparts enhanced stability of the final device.

The present invention is also directed to a process for fabricating a thin film semiconductor device, comprising, not necessarily in the following order, the steps of: (a) depositing, onto a substrate, a thin film of organic semiconductor material comprising a heteropyrene compound, such that the thin film of organic semiconductor material exhibits a p-type field effect mobility that is greater than 0.01 cm$^2$/Vs; (b) forming a spaced apart source electrode and drain electrode, wherein the source electrode and the drain electrode are separated by, and electrically connected with, the p-type semiconductor film; and (c) forming a gate electrode spaced apart from the semiconductor material.

Preferably, the compound is deposited on the substrate by sublimation or by solution-phase deposition, wherein the substrate has a temperature of no more than 250° C., preferably no more than 100° C., during deposition.

As used herein, "a" or "an" or "the" are used interchangeably with "at least one," to mean "one or more" of the element being modified.

As used herein, the terms "over," "above," and "under" and the like, with respect to layers in an electronic component comprising the thin film semiconductor, usually the order of the layers over a support or substrate, but do not necessarily indicate that the layers are immediately adjacent or that there are no intermediate layers.

Unless otherwise specifically stated, use of the term "substituted" or "substituent" means any group or atom other than hydrogen. Additionally, when the term group or substituent is used, it means that when a substituent group contains a substitutable hydrogen, it is also intended to encompass not only the substituent's unsubstituted form, but also its form to the extent it can be further substituted (up to the maximum possible number) with any substituent, group, or groups so long as the substituent does not destroy properties necessary for semiconductor utility. If desired, the substituents may themselves be further substituted one or more times with acceptable substituent groups. For example, an alkyl or alkoxy group can be substituted with one or more fluorine atoms. When the compound has two or more substituents, the substituents may be joined together to form an optional aliphatic, unsaturated, or aromatic ring as a bridge between substituents or a ring fused to the heteropyrene nucleus unless otherwise provided.

BRIEF DESCRIPTION OF THE DRAWINGS

The above and other objects, features, and advantages of the present invention will become more apparent when taken in conjunction with the following description and drawings wherein identical reference numerals have been used, where possible, to designate identical or analogous features that are common to the figures, and wherein.

DESCRIPTION OF THE INVENTION

The present semiconductor thin film materials are useful, for example, in thin film transistors and the like. Cross-sectional views of typical organic thin film transistor are shown in FIGS. 1 and 2, wherein FIG. 1 illustrates a typical bottom contact configuration and FIG. 2 illustrates a typical top contact configuration.

Figure 1:
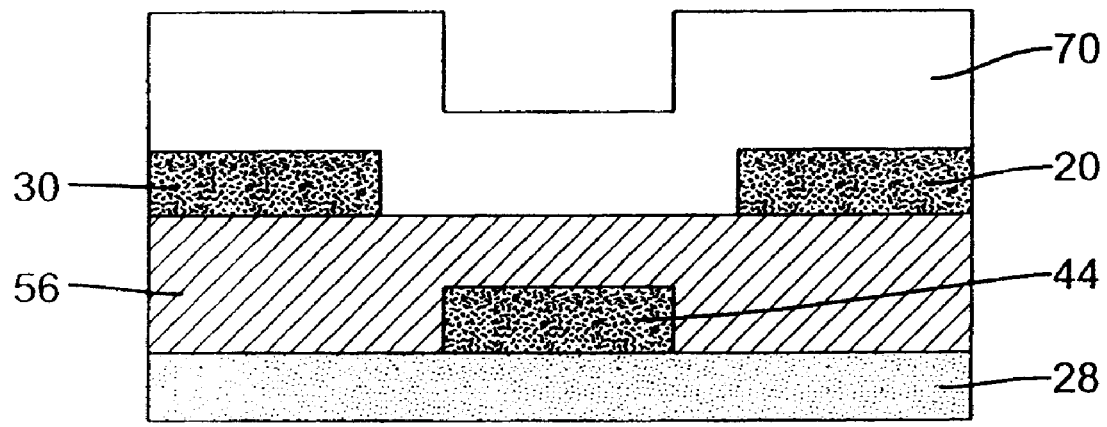
FIG. 1 illustrates a cross-sectional view of a typical organic thin film transistor having a bottom contact configuration.
Figure 2:
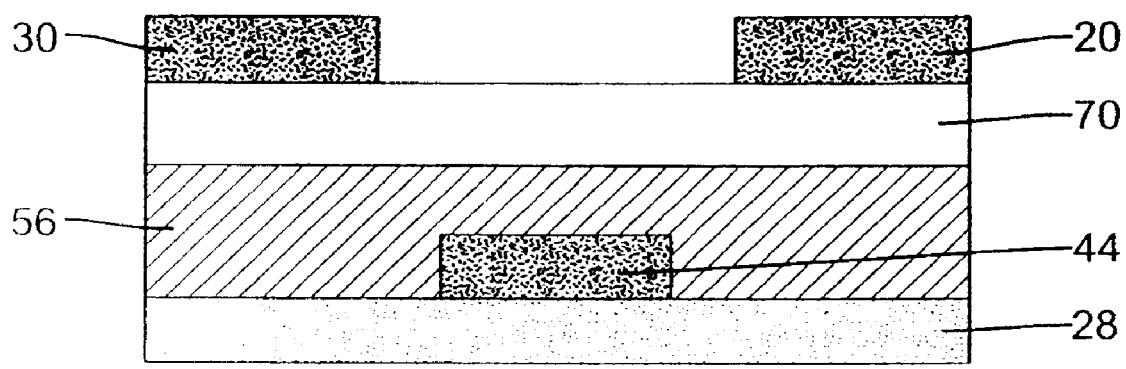
FIG. 2 illustrates a cross-sectional view of a typical organic thin film transistor having a top contact configuration

Each thin film transistor (TFT) in FIGS. 1 and 2 contains a source electrode 20, a drain electrode 30, a gate electrode 44, a gate dielectric 56, a substrate 28, and the semiconductor 70 of the invention in the form of a film connecting the source electrode 20 to drain electrode 30, which semiconductor comprises a compound selected from the class of compounds based on a fused heteropyrene containing a terminal thiophene group described herein.

When the TFT operates in an accumulation mode, the charges injected from the source electrode 20 into the semiconductor 70 are mobile and a current flows from source electrode to drain electrode, mainly in a thin channel region within about 100 Angstroms of the semiconductor-dielectric interface. See A. Dodabalapur, L. Torsi, H. E. Katz, *Science* 1995, 268, 270, hereby incorporated by reference. In the configuration of FIG. 1, the charge need only be injected laterally from the source electrode 20 to form the channel. In the absence of a gate field the channel ideally has few charge carriers; as a result there is ideally no source-drain conduction.

The off current is defined as the current flowing between the source electrode 20 and the drain electrode 30 when charge has not been intentionally injected into the channel by the application of a gate voltage. For a p-channel accumulation-mode TFT such as is typical for many organic semiconductors, the off behavior occurs for a gate-source voltage more positive than a certain voltage known as the threshold voltage. See Sze in *Semiconductor Devices—Physics and Technology*, John Wiley & Sons (1981), pages 438-443. The on current is defined as the current flowing between the source electrode 20 and the drain electrode 30 when charge carriers have been accumulated intentionally in the channel by application of an appropriate voltage to the gate electrode 44, and the channel is conducting. For a p-channel accumulation-mode TFT, this occurs at gate-source voltages more negative than the threshold voltage. This ensures that when the gate is held at ground along with the source, the device is in the off mode. Switching between on and off is accomplished by the application and removal of an electric field from the gate electrode 44 across the gate dielectric 56 to the semiconductor-dielectric interface, effectively charging a capacitor.

In accordance with the invention, the organic semiconductor materials used in the present invention can exhibit high performance under ambient conditions without the need for special chemical underlayers.

The semiconductor film of the present invention, comprising a heteropyrene compound as described herein is capable of exhibiting p-type field effect mobility greater than $10^{-6}$ cm$^2$/Vs and preferably greater than 0.001 cm$^2$/Vs.

In addition, the semiconductor film of the invention is capable of providing on/off ratios of at least $10^2$, advantageously at least $10^5$. The on/off ratio is the ratio of the maximum to the minimum drain current as the gate voltage is varied from 5 to −50V, and employing a silicon dioxide gate dielectric.

As indicated above, the invention is directed to an article comprising a thin film of an organic semiconductor material that comprises a heteropyrene compound represented by the following Structure I:

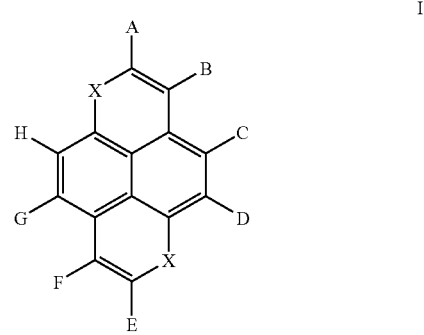

wherein: each X is independently selected from O or S and A, B, C, D, E, F, G, and H are independently hydrogen or a substituent that is consistent with the effective semiconducting properties of the compound in a thin film, and wherein any two of the substituents A, B, C, D, E, F, G, and H can optionally form a non-aromatic ring fused to the heteropyrene moiety, and wherein A and B, and/or E and F, can optionally form an aromatic ring fused to the heteropyrene moiety in Structure I.

The substituents A, B, C, D, E, F, G, and H are preferably selected not to adversely affect, but rather to improve the effective properties of the compound compared to the compound in which the substitutes are all hydrogen. More preferably all substituents A, B, C, D, E, F, G, and H are independently selected from hydrogen and organic groups containing 1 to 12 carbon atoms, preferably 1 to 6 carbon atoms, which groups may contain other atoms such as oxygen, sulfur, nitrogen, phosphorous, or fluorine, although preferably electron donating groups.

In a preferred embodiment, each X is independently selected from O or S and A, B, C, D, E, F, G, and H are each hydrogen or a substituted or unsubstituted alkyl or aryl or alkyl aryl substituent, and wherein optionally any two substituents in combination can may form a cycloalkyl ring or rings and or any two of A and B, S and/or D and F, can optionally form a fused benzo ring.

Two preferred embodiments are, respectively described by Structure II and III.

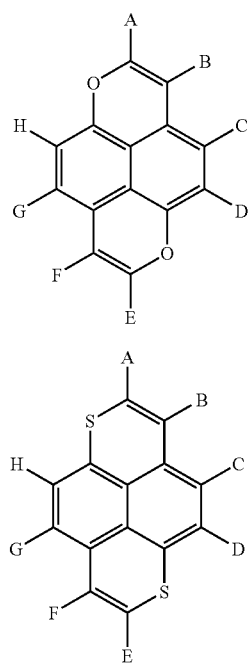

wherein (for either Structure II and III): A, B, C, D, E, F, G, and H are each independently hydrogen or a substituent as in Structure I, and wherein the substituents may form a ring or rings as in Structure I.

In preferred embodiments of Structure I, II, and III, substituents B, C, D, F, G, and H are independently hydrogen or an alkyl or aryl substituent, either substituted or unsubstituted, and substituents A and E are organic substituent as in Structure I.

In another preferred embodiment of Structure I, II, and II, the substituents C, D, G, and H are hydrogen and A, B, E, and F are independently a substituent in which substituents And B, and/or E and F, can form an aromatic or non-aromatic fused ring or rings having 5 to 7 carbon atoms in each ring.

In still other preferred embodiments the substituents A, B, C, D, E, F, G, and H may be independently selected from hydrogen and various organic substituents or groups. In one preferred embodiment, these groups, especially A, B, E, and F, more especially A and E, may contain an oxygen-containing organic substituent and/or a carbon-containing substituent. Preferred oxygen-containing substituents include alkoxy, aryloxy, carboalkyl (—C(=O)R), carboaryl (—C(=O)Ar), carboalkoxy (—C(=O)OR), carboaryloxy (—C(=O)OAr) either substituted or unsubstituted. Preferred carbon-containing substituents include alkyl groups of about 1-20 carbons, cycloalkyl groups of about 1-20 carbons, aryl groups of about 6-20 carbons, alkaryl groups of about 6-20 carbons, and heterocyclic groups having at least one heteroatom and 2-20 carbons; all either substituted or unsubstituted. Other preferred oxygen-containing organic substituents include alkylaryl or alkyl ketones (—R—C(=O)R) or (—R—C(=O)Ar), all either substituted or unsubstituted. Other suitable A, B, C, D, E, F, G, and H especially A, B, E, and F substituents, and more especially A and E, may include, but are not limited to halogens; cyano (—CN); hydroxyl, amino, alkylamino, cyano, nitro, carboxy, aminocarbonyl, sulfonamido, sulfamoyl, sulfo, sulfonate, or alkylammonium. Furthermore, any two members of the following set of A, B, C, D, E, F, G, and H, particularly two most adjacent groups may be joined to form a fused ring (including rings bridging substituents), either aliphatic or unsaturated, and A, B, E, and F may optionally be a fused ring that is aromatic, provided that creation of any ring will not unduly interfere with the functioning of the semiconductor thin film comprised of the compound in accordance with the invention.

Examples of substituents on any of the mentioned groups can include known substituents, such as: chloro, fluoro, bromo, iodo; hydroxy; alkoxy, particularly those "lower alkyl" (that is, with 1 to 12 carbon atoms, for example, methoxy, ethoxy; substituted or unsubstituted alkyl, particularly lower alkyl (for example, methyl, trifluoromethyl); thioalkyl (for example, methylthio or ethylthio), particularly either of those with 1 to 12 carbon atoms; substituted or unsubstituted alkenyl, preferably of 2 to 12 carbon atoms (for example, ethenyl, propenyl, or butenyl); substituted and unsubstituted aryl, particularly those having from 6 to 20 carbon atoms (for example, phenyl); and substituted or unsubstituted heteroaryl, particularly those having a 5 or 6-membered ring containing 1 to 3 heteroatoms selected from N, O, or S (for example, pyridyl, thienyl, furyl, pyrrolyl); acid or acid salt groups; such groups as hydroxyl, amino, alkylamino, cyano, nitro, carboxy, carboxylate, acyl, alkoxycarbonyl, aminocarbonyl, sulfonamido, sulfamoyl, sulfo, sulfonate, or alkylammonium; and other groups known in the art. Further, with regard to any alkyl group or alkylene group, it will be understood that these can be branched or unbranched and include ring structures.

Further examples of any of the alkyl groups mentioned for the substituents in any of Structures I, II, or III herein are methyl, ethyl, propyl, isopropyl, butyl, isobutyl, t-butyl, pentyl, hexyl, octyl, 2-ethylhexyl, and congeners. Alkyl or other organic groups preferably have 1 to 12 carbon atoms, more preferably 1 to 8 carbon atoms, most preferably 1 to 4 carbon atoms, and are intended to include branched or linear groups. Alkenyl groups, for example, can be vinyl, 1-propenyl, 1-butenyl, 2-butenyl, and congeners. Alkynl groups, for example, can be ethynyl, 1-propynyl, 1-butynyl, and congeners. Aryl groups, for example, can be phenyl, naphthyl, styryl, and congeners. Arylalkyl groups, for example, can be benzyl, phenethyl, and congeners.

When referring to electron donating groups herein, this can be indicated or estimated by the Hammett substituent constant ($\sigma_p$, $\sigma_m$), as described by L. P. Hammett in *Physical Organic Chemistry* (McGraw-Hill Book Co., NY, 1940), or by the Taft polar substituent constants ($\sigma_t$) as defined by R. W. Taft in *Steric Effects in Organic Chemistry* (Wiley and Sons, NY, 1956), and in other standard organic textbooks. Subsequent work has extended and refined the original concept and data, but for the purposes of prediction and correlation, standard sets of $\sigma_p$ are widely available in the chemical literature, as for example in C. Hansch et al., *J. Med. Chem.*, 17, 1207 (1973). Preferably, an electron donating group has a $\sigma_p$ or $\sigma_m$ of less than zero, more preferably less than −0.05, most preferably less than −0.1. The $\sigma_p$ value can be used to indicate the electron donating nature of the group in a structure according to the present invention, as in Structure I, II, or III herein.

Specific illustrative examples of useful heteropyrene compounds and derivatives are shown by the formulae below:

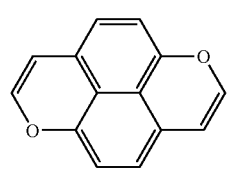

SC-1

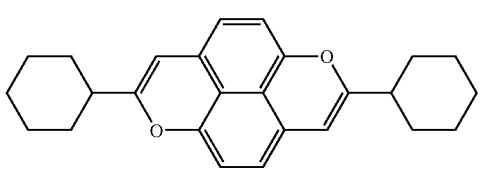

SC-2

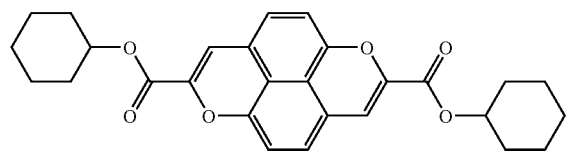

SC-3

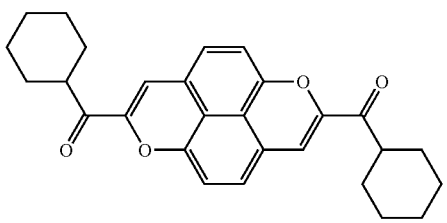

SC-4

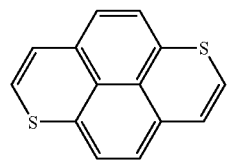

SC-5

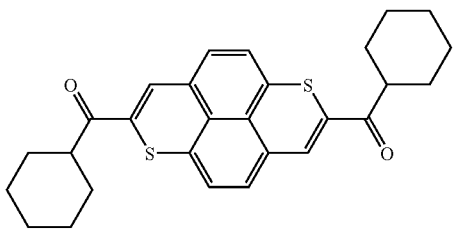

SC-6

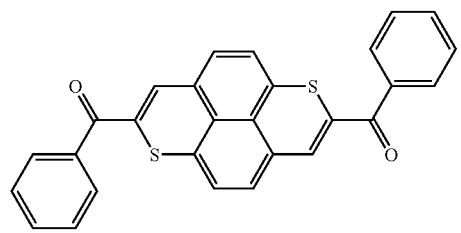

SC-7

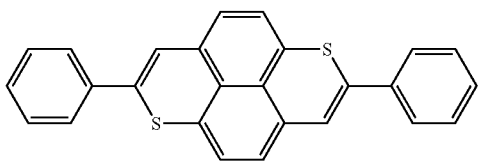

SC-8

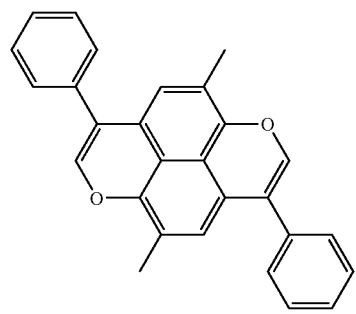

SC-9

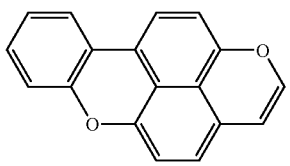

SC-10

-continued

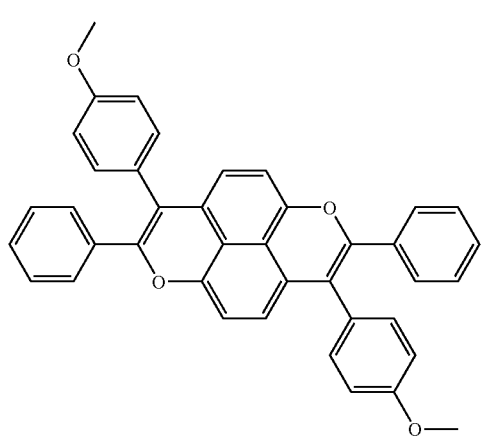
SC-11

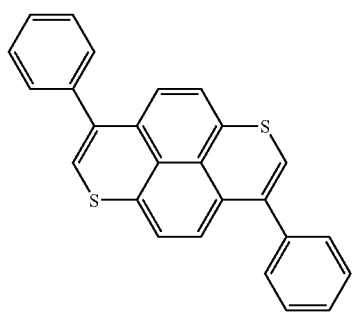
SC-12

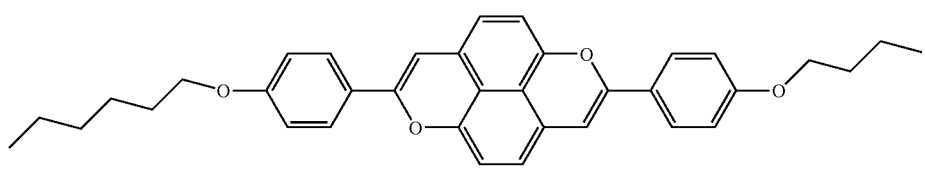
SC-13

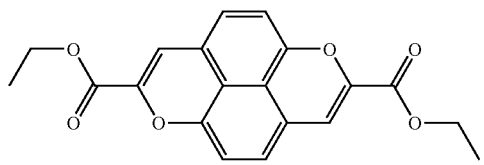
SC-14

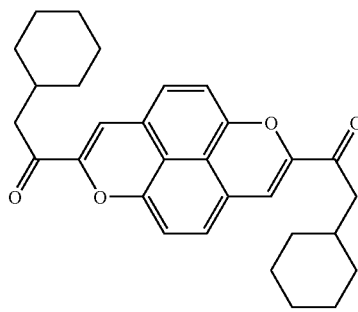
SC-15

The compounds of the invention can be prepared by methods disclosed in the literature or by standard organic chemical techniques available to one trained in the art. Buisson and Demerseman reported the synthesis of 1,6-dioxapyrene (*Journal of Heterocyclic Chemistry* (1990), 27(7), 2213-14). An improved procedure was subsequently described by Mortensen et al. (*Acta Chemica Scandinavica* (1997), 51(6/7) 807-809). The preparation of various 1,6-dioxapyrene derivatives was also documented by Christensen and co-workers (*Journal of Organic Chemistry* (1991), 56, 7055-7058). The synthesis of 1,6-dithiapyrene has been well documented in the chemical literature; a notable contribution is that by Morita et al., wherein both the parent compound and a iodinated derivatives were prepared (*Bulletin of the Chemical Society of Japan* (2003), 76(1), 205-206).

Another aspect of the invention relates to process for the production of semiconductor components and electronic devices incorporates such components. In one embodiment, a substrate is provided and a layer of the semiconductor material as described above can be applied to the substrate, electrical contacts being made with the layer. The exact process sequence is determined by the structure of the desired semiconductor component. Thus, in the production of an organic field effect transistor, for example, a gate electrode can be first deposited on a flexible substrate, for example an organic polymer film, the gate electrode can then be insulated with a dielectric and then source and drain electrodes and a layer of the semiconductor material can be applied on top. The structure of such a transistor and hence the sequence of its production can be varied in the customary manner known to a person skilled in the art. Thus, alternatively, a gate electrode can be deposited first, followed by a gate dielectric, then the organic semiconductor can be applied, and finally the contacts for the source electrode and drain electrode deposited on the semiconductor layer. A third structure could have the source and drain electrodes deposited first, then the organic semiconductor, with dielectric and gate electrode deposited on top.

In yet another embodiment of the present invention, source drain and gate can all be on a common substrate and the gate dielectric can enclose gate electrode such that gate electrode is electrically insulated from source electrode and drain electrode, and the semiconductor layer can be positioned over the source, drain and dielectric.

The skilled artisan will recognize other structures can be constructed and/or intermediate surface modifying layers can be interposed between the above-described components of the thin film transistor.

A support can be used for supporting the TFT during manufacturing, testing, and/or use. The skilled artisan will appreciate that a support selected for commercial embodiments may be different from one selected for testing or screening various embodiments. In some embodiments, the support does not provide any necessary electrical function for the TFT. This type of support is termed a "non-participating support" in this document. Useful materials can include organic or inorganic materials. For example, the support may comprise inorganic glasses, ceramic foils, polymeric materials, filled polymeric materials, coated metallic foils, acrylics, epoxies, polyamides, polycarbonates, polyimides, polyketones, poly(oxy-1,4-phenyleneoxy-1,4-phenylenecarbonyl-1,4-phenylene) (sometimes referred to as poly(ether ether ketone) or PEEK), polynorbornenes, polyphenyleneoxides, poly(ethylene naphthalenedicarboxylate) (PEN), poly(ethylene terephthalate) (PET), poly(phenylene sulfide) (PPS), and fiber-reinforced plastics (FRP).

A flexible support is used in some embodiments of the present invention. This allows for roll processing, which may be continuous, providing economy of scale and economy of manufacturing over flat and/or rigid supports. The flexible support chosen preferably is capable of wrapping around the circumference of a cylinder of less than about 50 cm diameter, more preferably 25 cm diameter, most preferably 10 cm diameter, without distorting or breaking, using low force as by unaided hands. The preferred flexible support may be rolled upon itself.

In some embodiments of the invention, the support is optional. For example, in a top construction as in FIG. 2, when the gate electrode 44 and/or gate dielectric 56 provides sufficient support for the intended use of the resultant TFT, the support is not required. In addition, the support may be combined with a temporary support. In such an embodiment, a support may be detachably adhered or mechanically affixed to the support, such as when the support is desired for a temporary purpose, e.g., manufacturing, transport, testing, and/or storage. For example, a flexible polymeric support may be adhered to a rigid glass support, which support could be removed.

The gate electrode can be any useful conductive material. A variety of gate materials known in the art, are also suitable, including metals, degenerately doped semiconductors, conducting polymers, and printable materials such as carbon ink or silver-epoxy. For example, the gate electrode may comprise doped silicon, or a metal, such as aluminum, chromium, gold, silver, nickel, palladium, platinum, tantalum, and titanium. Conductive polymers also can be used, for example polyaniline, poly(3,4-ethylenedioxythiophene)/poly(styrene sulfonate) (PEDOT:PSS). In addition, alloys, combinations, and multilayers of these materials may be useful.

In some embodiments of the invention, the same material can provide the gate electrode function and also provide the support function of the support. For example, doped silicon can function as the gate electrode and support the TFT.

The gate dielectric is provided on the gate electrode. This gate dielectric electrically insulates the gate electrode from the balance of the TFT device. Thus, the gate dielectric comprises an electrically insulating material. The gate dielectric should have a dielectric constant above about 2, more preferably above about 5. The dielectric constant of the gate dielectric also can be very high if desired, for example, 80 to 100 or even higher. Useful materials for the gate dielectric may comprise, for example, an inorganic electrically insulating material. The gate dielectric may comprise a polymeric material, such as polyvinylidenedifluoride (PVDF), cyanocelluloses, polyimides, etc.

Specific examples of materials useful for the gate dielectric include strontiates, tantalates, titanates, zirconates, aluminum oxides, silicon oxides, tantalum oxides, titanium oxides, silicon nitrides, barium titanate, barium strontium titanate, barium zirconate titanate, zinc selenide, and zinc sulfide. In addition, alloys, combinations, and multilayers of these examples can be used for the gate dielectric. Of these materials, aluminum oxides, silicon oxides, and zinc selenide are preferred. In addition, polymeric materials such as polyimides, and insulators that exhibit a high dielectric constant. Such insulators are discussed in U.S. Pat. No. 5,981,970 hereby incorporated by reference.

The gate dielectric can be provided in the TFT as a separate layer, or formed on the gate such as by oxidizing the gate material to form the gate dielectric. The dielectric layer may comprise two or more layers having different dielectric constants.

The source electrode and drain electrode are separated from the gate electrode by the gate dielectric, while the organic semiconductor layer can be over or under the source electrode and drain electrode. The source and drain electrodes can be any useful conductive material. Useful materials include most of those materials described above for the gate electrode, for example, aluminum, barium, calcium, chromium, gold, silver, nickel, palladium, platinum, titanium, polyaniline, PEDOT:PSS, other conducting polymers, alloys thereof, combinations thereof, and multilayers thereof.

The thin film electrodes (e.g., gate electrode, source electrode, and drain electrode) can be provided by any useful means such as physical vapor deposition (e.g., thermal evaporation, sputtering) or ink jet printing. The patterning of these electrodes can be accomplished by known methods such as shadow masking, additive photolithography, subtractive photolithography, printing, microcontact printing, and pattern coating.

The organic semiconductor layer can be provided over or under the source and drain electrodes, as described above in reference to the thin film transistor article. The present invention also provides an integrated circuit comprising a plurality of TFTs made by the process described herein. The semiconductor material made using the above compounds based on a fused acene containing a terminal thiophene group are capable of being formed on any suitable substrate which can comprise the support and any intermediate layers such as a dielectric or insulator material, including those known in the art.

The entire process of making the thin film transistor or integrated circuit of the present invention preferred is carried out below a maximum support temperature of about 250° C., more preferably below about 250° C., even more preferably below about 150° C., and most preferably below about 100° C., or even at temperatures around room temperature (about 25° C. to 70° C.). The temperature selection generally depends on the support and processing parameters known in the art, once one is armed with the knowledge of the present invention contained herein. These temperatures are well below traditional integrated circuit and semiconductor processing temperatures, which enables the use of any of a variety of relatively inexpensive supports, such as flexible polymeric supports. Thus, the invention enables production of relatively inexpensive integrated circuits containing organic thin film transistors with significantly improved performance.

Compounds used in the invention can be readily processed and are thermally stable to such as extent that they can be vaporized. The compounds possess significant volatility, so that vapor phase deposition, where desired, is readily achieved. Such compounds can be deposited onto substrates by vacuum sublimation or by solvent processing, including dip coating, drop casting, spin coating, blade coating.

Deposition by a rapid sublimation method is also possible. One such method is to apply a vacuum of 35 mtorr to a chamber containing a substrate and a source vessel that holds the compound in powdered form, and heat the vessel over several minutes until the compound sublimes onto the substrate. Generally, the most useful compounds form well-ordered films, with amorphous films being less useful.

Alternatively, for example, the compounds described above can first be dissolved in a solvent prior to spin-coating or printing for deposition on a substrate.

Devices in which the semiconductor films of the invention are useful include especially thin film transistors (TFTs), especially organic field effect thin-film transistors (TFTs). Also, such films can be used in various types of devices having organic p-n junctions, such as described on pages 13 to 15 of US 2004,0021204 A1 to Liu, which patent is hereby incorporated by reference.

Electronic devices in which TFTs and other devices are useful include, for example, more complex circuits, e.g., shift registers, integrated circuits, logic circuits, smart cards, memory devices, radio-frequency identification tags, backplanes for active matrix displays, active-matrix displays (e.g. liquid crystal or OLED), solar cells, ring oscillators, and complementary circuits, such as inverter circuits, for example, in combination with other transistors made using available n-type organic semiconductor materials. In an active matrix display, a transistor according to the present invention can be used as part of voltage hold circuitry of a pixel of the display. In devices containing the TFTs of the present invention, such TFTs are operatively connected by means known in the art. The present invention further provides a method of making any of the electronic devices described above. Thus, the present invention is embodied in an article that comprises one or more of the TFTs described. The present thin film semiconductor materials can also be used in other devices including OLED and photovoltaic devices for their semiconducting properties.

Advantages of the invention will be demonstrated by the following examples, which are intended to be exemplary.

A. Materials

The compounds of the invention can be prepared by methods disclosed in the literature or by standard organic chemical techniques available to one trained in the art, as generally described above.

The following 1,6-dioxapyrene compound (SC-3) containing cyclohexyl ester groups, was prepared and tested.

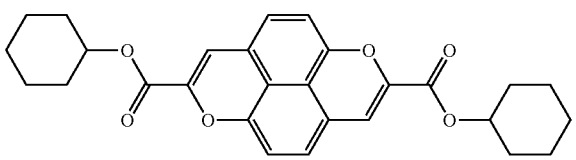

SC-3

Synthetic Procedure for SC-3:

The SC-3 semiconductor compounds was prepared as follows. A solution of ethyl 1,6-dioxapyrene-2,7-dicarboxylate (SC-15; CAS 193902-20-4; 1.76 g, 5.00 mmol) was stirred at 160° C. in cyclohexanol (50 mL) with concentrated sulfuric acid (0.25 mL) for 7 h. The mixture was cooled to ambient temperature and diluted with several volumes of xylenes and methylene chloride followed by addition of 2 mL of triethylamine. The entire mixture was concentrated in vacuo. Portions of xylenes (3×200 mL) were added and distilled off in vacuo to remove residual cyclohexanol. The resultant crude material was passed through silica gel, eluting with methylene chloride to provide a red-orange solid (1.95 g, 85%). This solid was recrystallized from propionitrile to afford a red-orange solid (1.76 g, 76%). This material proved chromatographically homogenous and displayed spectral characteristic consistent with its assigned structure.

The following 1,6-dithiapyrene compound (SC-5) was prepared and tested.

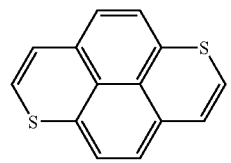

SC-5

Synthetic Procedure for SC-5:

The SC-5 semiconductor compound, 1,6-dithiapyrene, was prepared essentially using the method of Morita et al. (vide supra).

The following 1,6-dioxapyrene compound containing terminal ketocyclohexyl groups (SC-4) was prepared.

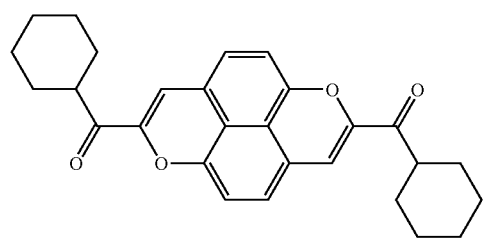

SC-4

Synthetic Procedure for SC-4:

The SC-4 semiconductor compounds was prepared as follows. A mixture of 1,5-dihydroxy-naphthalene-4,8-dicarboxaldehyde (CAS 128038-46-0;1.34 g, 6.2 mmol), 2-bromo-1-cyclohexylethanone (CAS 56077-28-2; 3.67 g, 17.9 mmol), cesium carbonate (8.0 g, 12 mmol), and 50 mL of tetrahydrofuran was stirred under argon at 25° C. for 4 days, then at reflux for 18 h. The reaction mixture was cooled to 25° C., filtered, and concentrated to deposit a red paste. The product was purified by column chromatography followed by recrystallization from a mixture of toluene and heptane to produce the title compound. Mass and NMR spectra were consistent with the assigned structure.

The following 1,6-dioxapyrene compound containing terminal ketomethylcyclohexyl groups (SC-15) was prepared

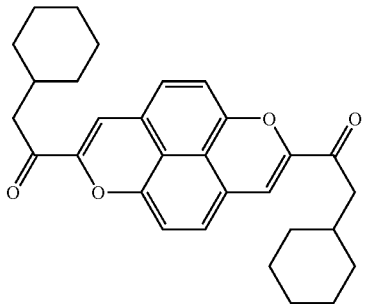

SC-15

Synthetic Procedure for SC-15:

The SC-15 semiconductor compound was prepared as follows. A mixture of 1,5-dihydroxy-naphthalene-4,8-dicarboxaldehyde (CAS 128038-46-0; 1.28 g, 5.9 mmol), 1-bromo-3-cyclohexyl-2-propanone (CAS 152757-52-3; 3.72 g, 17.0 mmol), cesium carbonate (4.8 g, 15 mmol), and 50 mL of tetrahydrofuran was stirred under argon at 25° C. for 4 days, then at reflux for 18 h. The reaction mixture was cooled to 25° C., filtered, and concentrated to deposit a red solid. The product was purified by column chromatography followed by recrystallization from a mixture of toluene and heptane to produce of the title compound. Mass and NMR spectra were consistent with the assigned structure.

B. Device Preparation

In order to test the electrical characteristics of the various materials of this invention, field-effect transistors were typically made using the top-contact geometry. The substrate used is a heavily doped silicon wafer, which also serves as the gate of the transistor. The gate dielectric is a thermally grown $SiO_2$ layer with a thickness of 185 nm.

An active layer of heteropyrene was deposited via vacuum deposition in a thermal evaporator. The deposition rate was 0.1 Angstroms per second while the substrate temperature was held at 22° C. for most experiments. The thickness of the active layer was a variable in some experiments, but was typically 17-20 nm. Gold contacts of thickness 50 nm were deposited through a shadow mask. The channel width was held at 650 microns, while the channel lengths were varied between 50 and 150 microns. Some experiments were performed to look at the effect of other contact materials. A few devices were made with a bottom-contact geometry, in which the contacts were deposited prior to the active material.

Thin films of each heteropyrene semiconductor material were evaporated on octadecyltrichlorosilane (OTS) treated 185-nm-thick $SiO_2$ dielectric on a heavily doped n-Si which served as the gate electrode. Gold top contacts were used as the source and drain. The purified semiconducting material SC-3 was deposited by vacuum sublimation at a pressure of $5 \times 10^{-7}$ Torr and a rate of 0.1 Angstroms per second to a thickness of 20 nm as measured by a quartz crystal. During deposition the substrate was held at a constant temperature of 22° C. The sample was exposed to air for a short time prior to subsequent deposition of gold (Au) source and drain electrodes through a shadow mask to a thickness of 50 nm. The devices made had a 650 micron channel width, with channel lengths varying from 50-150 microns.

C. Device Measurement and Analysis

Electrical characterization of the fabricated devices was performed with a HEWLETT-PACKARD HP 4145B parameter analyzer. The probe measurement station was held in a positive $N_2$ environment for all measurements with the exception of those purposely testing the stability of the devices in air. The measurements were performed under sulfur lighting unless sensitivity to white light was being investigated. The devices were exposed to air prior to testing.

For each device, the drain current (Id) was measured as a function of source-drain voltage (Vd) for various values of gate voltage (Vg). For most devices, Vd was swept from 0 to −50 V for each of the gate voltages measured. The gate voltage for this measurement was typically stepped from 0 to −50V in increments of 10V. In these measurements, the gate current (Ig) was also recorded in to detect any leakage current through the device. Furthermore, for each device the drain current was measured as a function of gate voltage for various values of source-drain voltage. For most devices, Vg was swept from 5 V to −50 V for each of the drain voltages measured, typically −30 V, −40 V, and −50 V.

Parameters extracted from the data include field-effect mobility (μ), threshold voltage (Vth), subthreshold slope (S), and the ratio of Ion/Ioff for the measured drain current. The field-effect mobility was extracted in the saturation region, where Vd>Vg−Vth. In this region, the drain current is given by the equation (see Sze in *Semiconductor Devices—Physics and Technology*, John Wiley & Sons (1981)):

$$I_d = \frac{W}{2L}\mu C_{ox}(V_g - V_{th})^2$$

where W and L are the channel width and length, respectively, and $C_{ox}$ is the capacitance of the oxide layer, which is a function of oxide thickness and dielectric constant of the material. Given this equation, the saturation field-effect mobility was extracted from a straight-line fit to the linear portion of the $\sqrt{I_d}$ versus Vg curve. The threshold voltage, $V_{th}$, is the x-intercept of this straight-line fit. Mobilities can also be extracted from the linear region, where Vd≦Vg−Vth. Here the drain current is given by the equation (see Sze in *Semiconductor Devices—Physics and Technology*, John Wiley & Sons (1981)):

$$I_d = \frac{W}{L}\mu C_{ox}\left[V_d(V_g - V_{th}) - \frac{V_d^2}{2}\right]$$

For these experiments, mobilities in the linear regime were not extracted, since this parameter is very much affected by any injection problems at the contacts. Non-linearities in the curves of $I_d$ versus $V_d$ at low $V_d$ indicate that the performance of the device is limited by injection of charge by the contacts. In order to obtain results that are more independent of contact imperfections of a given device, the saturation mobility rather than the linear mobility was extracted as the characteristic parameter of device performance.

The log of the drain current as a function of gate voltage was plotted. Parameters extracted from the log $I_d$ plot include the $I_{on}/I_{off}$ ratio and the sub-threshold slope (S). The $I_{on}/I_{off}$ ratio is simply the ratio of the maximum to minimum drain current, and S is the inverse of the slope of the $I_d$ curve in the region over which the drain current is increasing (i.e. the device is turning on).

D. Results

The following examples demonstrate that organic thin film transistor devices comprising heteropyrenes according to the present invention behave as p-channel semiconductor materials having useful mobility and on/off ratio. The mobility calculated in the saturation region was between 0.001 to 0.2 $cm^2/Vs$, with an on/off ratio of $10^4$ to $10^5$. In addition to the improved performance, the devices also show excellent reproducibility.

EXAMPLE 1

This example demonstrates the p-type TFT device made from Compound SC-3. A heavily doped silicon wafer with a thermally-grown $SiO_2$ layer with a thickness of 185 nm was used as the substrate. The wafer was cleaned for 10 minutes in a piranah solution, followed by a 6-minute exposure in a UV/ozone chamber. The cleaned surface was then treated with a self-assembled monolayer of octadecyltrichlorosilane (OTS), made from a heptane solution under a humidity-controlled environment. Water contact angles and layer thicknesses were measured to ensure the quality of the treated surface. Surfaces with a good quality OTS layer have water contact angles >90°, and thicknesses determined from ellipsometry in the range of 27 Å to 35 Å.

The purified SC-3 Compound was deposited by vacuum sublimation at a pressure of $2\times10^{-7}$ Torr and a rate of 0.1 Angstroms per second to a thickness of 17 nm as measured by a quartz crystal. During deposition the substrate was held at a constant temperature of 22° C. The sample was exposed to air for a short time prior to subsequent deposition of Au source and drain electrodes through a shadow mask to a thickness of 50 nm. The devices made had a 650 micron channel width, with channel lengths varying from 50 to 150 microns. Multiple TFTs were prepared and representative samples of 4 to 12 TFTs were tested for each deposition run.

The devices were exposed to air prior to measurement in an argon atmosphere using a HEWLETT-PACKARD 4145B semiconductor parameter analyzer. For each transistor, the field effect mobility, μ, was calculated from the slope of the $(I_D)^{1/2}$ versus $V_G$ plot. The average mobility was found to be 0.05 cm²/Vs in the saturation region. The average on-off ratio was $1\times10^4$, and the average threshold voltage was 15.1 V. Saturation mobilities of up to 0.1 cm²/Vs were measured for devices prepared in this way.

EXAMPLE 2

This example demonstrates the p-type TFT device made from an SC-5 Compound. A heavily doped silicon wafer with a thermally-grown SiO$_2$ layer with a thickness of 185 nm was used as the substrate. The wafer was cleaned for 10 minutes in a piranah solution, followed by a 6-minute exposure in a UV/ozone chamber. The cleaned surface was then treated with a self-assembled monolayer of octadecyltrichlorosilane (OTS), made from a heptane solution under a humidity-controlled environment. Water contact angles and layer thicknesses were measured to ensure the quality of the treated surface. Surfaces with a good quality OTS layer have water contact angles >90°, and thicknesses determined from ellipsometry in the range of 27 Å to 35 Å.

The purified Compound SC-5 was deposited by vacuum sublimation at a pressure of $2\times10^{-7}$ Torr and a rate of 0.1 Angstroms per second to a thickness of 17 nm as measured by a quartz crystal. During deposition the substrate was held at a constant temperature of 22° C. The sample was exposed to air for a short time prior to subsequent deposition of Au source and drain electrodes through a shadow mask to a thickness of 50 nm. The devices made had a 650 micron channel width, with channel lengths varying from 50 to 150 microns. Multiple TFTs were prepared and representative samples of 4 to 12 TFTs were tested for each deposition run.

The devices were exposed to air prior to measurement in an argon atmosphere using a HEWLETT-PACKARD 4145B semiconductor parameter analyzer. For each transistor, the field effect mobility, μ, was calculated from the slope of the $(I_D)^{1/2}$ versus $V_G$ plot. The average mobility was found to be 0.002 cm²/Vs in the saturation region. The average on-off ratio was $1\times10^5$, and the average threshold voltage was 17.1 V. Saturation mobilities of up to 0.1 cm²/Vs were measured for devices prepared in this way.

It should be understood that in these examples we are demonstrating the semiconducting properties of this new class of materials. In the examples above we have clearly demonstrated that inventive heteropyrenes of present invention exhibit p-type semiconductor behavior and are capable of transporting holes. In TFT applications, materials that are capable of charge transport with mobilities greater than $1\times10^{-6}$ are considered useful. Moreover, the mobility of an active transistor material can be optimized to even higher values by process optimization.

EXAMPLE 3

This example demonstrates the p-type TFT device made from an SC-4 Compound. A heavily doped silicon wafer with a thermally-grown SiO$_2$ layer with a thickness of 185 nm was used as the substrate. The wafer was cleaned for 10 minutes in a piranah solution, followed by a 6-minute exposure in a UV/ozone chamber. The cleaned surface was then treated with a self-assembled monolayer of octadecyltrichlorosilane (OTS), made from a heptane solution under a humidity-controlled environment. Water contact angles and layer thicknesses were measured to ensure the quality of the treated surface. Surfaces with a good quality OTS layer have water contact angles >90°, and thicknesses determined from ellipsometry in the range of 27 Å to 35 Å.

The purified Compound SC-4 was deposited by vacuum sublimation at a pressure of $2\times10^{-7}$ Torr and a rate of 0.5 Angstroms per second to a thickness of 40 nm as measured by a quartz crystal. During deposition the substrate was held at a constant temperature of 22° C. The sample was exposed to air for a short time prior to subsequent deposition of Au source and drain electrodes through a shadow mask to a thickness of 50 nm. The devices made had a 650 micron channel width, with channel lengths varying from 50 to 150 microns. Multiple TFTs were prepared and representative samples of 4 to 12 TFTs were tested for each deposition run.

The devices were exposed to air prior to measurement in an argon atmosphere using a HEWLETT-PACKARD 4145B semiconductor parameter analyzer. For each transistor, the field effect mobility, μ, was calculated from the slope of the $(I_D)^{1/2}$ versus $V_G$ plot. The average mobility was found to be 0.25 cm²/Vs in the saturation region. The average on-off ratio was $1\times10^6$, and the average threshold voltage was −5.2 V. Saturation mobilities of up to 0.5 cm²/Vs were measured for devices prepared in this way.

PARTS LIST 20 source electrode
28 substrate
30 drain electrode
44 gate electrode
56 gate dielectric
70 semiconductor

The invention claimed is:

1. An article that is a thin-film, field-effect transistor comprising:
a thin semiconductive film that consists essentially of a 1,6-heteropyrene compound as an organic semiconductor material, the 1,6-heteropyrene compound comprising heteroatoms at the 1,6-positions in the compound selected from the group consisting of oxygen and sulfur, wherein any of the positions on the compound's heteropyrene aromatic nucleus can be optionally substituted, any two of which substituents can be combined into a ring, either saturated, unsaturated or aromatic fused ring.

2. The article of claim 1 wherein the thin-film, field-effect transistor comprises a dielectric layer, a gate electrode, a source electrode and a drain electrode, and wherein the dielectric layer, the gate electrode, the thin film of organic semiconductor material, the source electrode, and the drain electrode are in any sequence as long as the gate electrode and the thin film of organic semiconductor material both contact the dielectric layer, and the source electrode and the drain electrode both contact the thin film of organic semiconductor material.

3. The article of claim 1, wherein the heteropyrene compound is represented by the following Structure I:

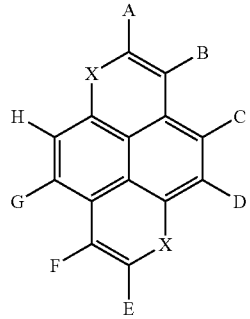

I wherein each X is independently selected from O or S and A, B, C, D, E, F, G, and H are independently hydrogen or a substituent that is consistent with the effective semiconducting properties of the compound in a thin film, and wherein any two of the substituents A, B, C, D, E, F, G, and H can optionally form a non-aromatic ring fused to the heteropyrene nucleus, and wherein A and B, and/or E and F, can optionally form an aromatic ring fused to the heteropyrene nucleus in Structure I.

4. The article of claim 3 wherein the substituents A, B, C, D, E, F, G, and H are independently selected from hydrogen and organic groups containing 1 to 12 carbon atoms, which groups may contain other atoms selected from the group consisting of such as oxygen, sulfur, nitrogen, phosphorous, or fluorine, which organic groups are selected not to have an undue adverse affect on the effective semiconductor properties of the heteropyrene compound.

5. The article of claim 3 wherein the substituents A, B, C, D, E, F, G, and H are each hydrogen or a substituted or unsubstituted alkyl, cycloalkyl, aryl, or alkylaryl substituent, and wherein optionally any two substituents in combination can may form a cycloalkyl or unsaturated ring or rings and/or any two of A and B, and/or D and F, can optionally form a fused benzo ring.

6. The article of claim 3 wherein the heteropyrene compound is substituted with at least one electron donating group.

7. The article of claim 3 wherein the substituents, if any, on the heteropyrene nucleus are all electron donating organic substituents.

8. The article of claim 6 wherein the at least one electron donating group is an alkyl group.

9. The article of claim 3, wherein in said structure A, B, C, D, E, F, G, and H are independently selected from H, $CH_3$, linear or branched $C_2$-$C_4$ alkyl, alkenyl, alkoxy, or other electron donating organic group having 1 to 12 carbon atoms, which group may be substituted with an oxygen atom or carbonyl group.

10. The article of claim 3, wherein the heteropyrene compound is represented by one of following two structures, Structure II and III:

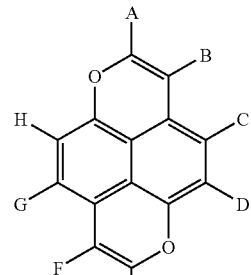

II

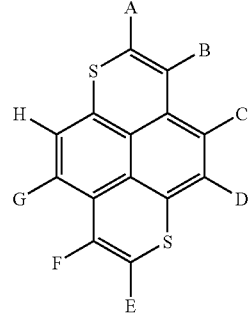

III

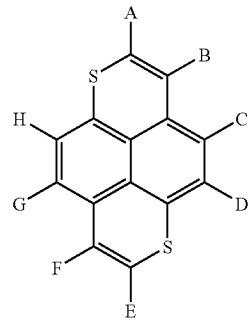

III wherein, for either Structure II and III, A, B, C, D, E, F, G, and H are each independently hydrogen or a substituent and wherein the substituents may form a ring or rings as defined above.

11. The article of claim 10, wherein in said Structure II or III, substituents B, C, D, F, G, and H are independently hydrogen or comprises an alkyl, cycloalkyl, or aryl substituent either substituted or unsubstituted.

12. The article of claim 10, wherein in said Structure II or III the substituents C, D, G, and H are hydrogen and A, B, E, and F are independently a substituent in which substituents A and B, and/or substituents E and F, can form an aromatic or non-aromatic fused ring or rings having 5 to 7 carbon atoms in each ring.

13. The article of claim 10, wherein in said Structure II or III the substituents A, B, C, D, E, F, G, and H may be independently selected from hydrogen and organic substituents selected from the group consisting of oxygen-containing organic substituents and/or a carbon-containing substituents, wherein oxygen-containing substituents have 1 to 12 carbon atoms and are selected from the group consisting of alkoxy, aryloxy, carboalkyl (—C(=O)R), carboaryl (—C(=O)Ar), carboalkoxy (—C(=O)OR), carboaryloxy (—C(=O)OAr), aryl or alkyl ketones (—RC(=O)R) or (—ArC(=O)Ar), all either substituted or unsubstituted all either substituted or unsubstituted, wherein R is a substituted or unsubstituted alky group having 1 to 11 carbon atoms and Ar is a substituted or unsubstituted aromatic group having 1 to 11 carbon atoms; and wherein carbon-containing substituents are selected from the group consisting of alkyl groups of 1 to 12 carbons, cycloalkyl groups of 1 to 12 carbons, aryl groups of 6 to 12 carbons, alkaryl groups of 6 to 12 carbons, and heterocyclic groups having at least one heteroatom and 2 to 12 carbons; all either substituted or unsubstituted; wherein optionally two most adjacent groups on the heteropyrene nucleus may be joined to form a fused ring, either aliphatic or unsaturated, and A, B, E, and F may optionally be a fused ring that is aromatic, provided that creation of any ring will not unduly interfere with the functioning of the semiconductor thin film comprised of the compound.

14. The article of claim 1 wherein the thin film of organic semiconducting material is capable of exhibiting electron mobility greater than 0.001 cm$^2$/Vs.

15. The article of claim 1 wherein the thin film transistor has an on/off ratio of a source/drain current of at least $10^4$.

16. The article of claim 2, wherein the gate electrode is adapted for controlling, by means of a voltage applied to the gate electrode, a current between the source and drain electrodes through the thin film of organic semiconductor material.

17. The article of claim 2 wherein the source, drain, and gate electrodes each independently comprise a material selected from doped silicon, metal, and a conducting polymer.

18. An electronic device selected from the group consisting of integrated circuits, active-matrix display, and solar cells comprising a multiplicity of thin film transistors according to claim 1.

19. The electronic device of claim 18 wherein the multiplicity of the thin film transistors is on a non-participating support that is optionally flexible.

* * * * *

UNITED STATES PATENT AND TRADEMARK OFFICE
CERTIFICATE OF CORRECTION

| | |
|---|---|
| PATENT NO. | : 7,781,076 B2 |
| APPLICATION NO. | : 11/768262 |
| DATED | : August 24, 2010 |
| INVENTOR(S) | : Deepak Shukla et al. |

Page 1 of 1

It is certified that error appears in the above-identified patent and that said Letters Patent is hereby corrected as shown below:

| Issued Patent | | Description of Error |
|---|---|---|
| Column | Line | |
| Cover Page (73), Col. 1 (Assignee) | 2 | Delete "NJ" and insert -- NY--, therefor. |
| First Page Col. 2 (Other Publications) | 4 | Delete "N0." and insert -- No. --, therefor. |
| 23 | 3-4 | In Claim 13, after "unsubstituted" delete "all either substituted or unsubstituted". |
| 23 | 4 | In Claim 13, delete "alky" and insert -- alkyl --, therefor. |

Signed and Sealed this
Seventeenth Day of May, 2011

David J. Kappos
*Director of the United States Patent and Trademark Office*